United States Patent
Shibata et al.

(10) Patent No.: US 7,915,671 B2
(45) Date of Patent: Mar. 29, 2011

(54) SEMICONDUCTOR DEVICE HAVING SUPER JUNCTION STRUCTURE

(75) Inventors: Takumi Shibata, Kariya (JP); Shouichi Yamauchi, Nagoya (JP)

(73) Assignee: DENSO CORPORATION, Kariya (JP)

( * ) Notice: Subject to any disclaimer, the term of this patent is extended or adjusted under 35 U.S.C. 154(b) by 903 days.

(21) Appl. No.: 12/153,032

(22) Filed: May 13, 2008

(65) Prior Publication Data

US 2008/0283912 A1 Nov. 20, 2008

(30) Foreign Application Priority Data

May 14, 2007 (JP) .................................. 2007-128565

(51) Int. Cl.
*H01L 29/78* (2006.01)
(52) U.S. Cl. ................. 257/329; 257/341; 257/E29.004
(58) Field of Classification Search .................. 257/329, 257/341, E29.004
See application file for complete search history.

(56) References Cited

U.S. PATENT DOCUMENTS

| 6,495,294 | B1 | 12/2002 | Yamauchi et al. | |
| 6,621,132 | B2* | 9/2003 | Onishi et al. ................. | 257/409 |
| 7,112,519 | B2 | 9/2006 | Yamaguchi et al. | |
| 2004/0016959 | A1 | 1/2004 | Yamaguchi et al. | |
| 2005/0006717 | A1 | 1/2005 | Yamaguchi et al. | |
| 2005/0221547 | A1* | 10/2005 | Yamauchi et al. ............ | 438/172 |
| 2006/0138407 | A1 | 6/2006 | Yamaguchi et al. | |
| 2006/0256487 | A1 | 11/2006 | Kishimoto et al. | |
| 2007/0072398 | A1 | 3/2007 | Shibata et al. | |

FOREIGN PATENT DOCUMENTS

| JP | A-2000-133801 | 5/2000 |
| JP | A-2000-260984 | 9/2000 |
| JP | 2001-332726 | * 11/2001 |
| JP | A-2001-332726 | 11/2001 |
| JP | A-2004-200441 | 7/2004 |
| JP | A-2004-273745 | 9/2004 |

OTHER PUBLICATIONS

Notice of Reason for Refusal mailed on Nov. 4, 2009 issued from the Japanese Patent Office in the corresponding Japanese patent application No. 2007-128565 (and English translation).

* cited by examiner

*Primary Examiner* — Jerome Jackson, Jr.
*Assistant Examiner* — Paul A Budd
(74) *Attorney, Agent, or Firm* — Posz Law Group, PLC

(57) ABSTRACT

A semiconductor device includes a silicon substrate having a (110)-oriented surface, a PN column layer disposed on the (110)-oriented surface, a channel-forming layer disposed on the PN column layer, a plurality of source regions disposed at a surface portion of the channel-forming layer, and gate electrodes penetrate through the channel-forming layer. The PN column layer includes first columns having a first conductivity type and second columns having a second conductivity type which are alternately arranged in such a manner that the first columns contact the second columns on (111)-oriented surfaces, respectively. The gate electrodes are adjacent to the source regions, respectively, and each of the gate electrodes has side surfaces that cross the contact surfaces of the first columns and the second columns in a plane of the silicon substrate.

10 Claims, 7 Drawing Sheets

US 7,915,671 B2

SEMICONDUCTOR DEVICE HAVING SUPER JUNCTION STRUCTURE

CROSS REFERENCE TO RELATED APPLICATION

The present application is based on and claims priority to Japanese Patent Application No. 2007-128565 filed on May 14, 2007, the contents of which are incorporated in their entirety herein by reference.

BACKGROUND OF THE INVENTION

1. Field of the Invention

The present invention relates to a semiconductor device having a super junction structure and method of manufacturing the same.

2. Description of the Related Art

Conventionally, a vertical metal-oxide-semiconductor (MOS) transistor can be highly integrated compared with a horizontal MOS transistor. Thus, the vertical MOS transistor can be suitably used for an electrical application, for example, for controlling electric power. However, in the vertical MOS transistor, a high breakdown voltage and a low on resistance have a trade-off relationship therebetween.

A semiconductor device that has a PN column layer functioning as a super junction (SJ) as a drift layer, that is, an SJ-MOS can improve a trade-off relationship between the high breakdown voltage and the low on resistance. For example, U.S. Pat. No. 6,621,132 (corresponding to JP-2002-76339A), JP-2004-200441A, and US 2005/0006717A (corresponding to JP-2005-19528A) respectively disclose an SJ-MOS.

An SJ-MOS 100 according to a first example of the related art and an SJ-MOS 200 according to a second example of the related art will now be described with reference to FIGS. 9A and 9B.

The SJ-MOS 100 and SJ-MOS 200 have similar structures. Each of the SJ-MOS 100 and the SJ-MOS 200 is an N-channel SJ-MOS and has an N+ type silicon substrate 1 functioning as a drain region. The SJ-MOS 100 has a PN column layer 10 on the silicon substrate 1, and the SJ-MOS 200 has a PN column layer 30 on the silicon substrate 1. Each of the PN column layers 10 and 30 is an epitaxial layer made of silicon and includes N type columns 2n and P type columns 2p. The N type columns 2n and the P type columns 2p have approximately rectangular parallelepiped shapes and are alternately arranged on the silicon substrate 1. On each of the PN column layers 10 and 30, a P type layer 3 functioning as a channel-forming layer is formed by an epitaxial layer made of silicon or ion implantation. At surface portions of the P type layer 3, N+ type regions 4 functioning as source regions are formed.

The SJ-MOS 100 has trench insulation gate electrodes (gate electrodes) 20 that penetrate through the P type layer 3. The SJ-MOS 200 has trench insulation gate electrodes (gate electrodes) 40 that penetrate through the P type layer 3. Each of the gate electrodes 20 and 40 has an approximately rectangular parallelepiped shape and has a sidewall insulation layer 5 and an embedded polysilicon 6. In a case where conductivity types of each component in the SJ-MOS 100 and the SJ-MOS 200 are reversed, a P channel SJ-MOS is provided.

In the SJ-MOS 100 and the SJ-MOS 200, the gate electrodes 20 and 40 are arranged on the PN column layers 10 and 30, respectively, in different manners. In the SJ-MOS 100 shown in FIG. 9A, the PN column layer 10, the gate electrodes 20, and the N+ type regions 4 are arranged approximately parallel in a planar direction of the silicon substrate 1. In the SJ-MOS 200 shown in FIG. 9B, the gate electrodes 20 and the source regions 4 are arranged orthogonally to the PN column layer 30 in the planar direction of the silicon substrate 1. Alternatively, the gate electrodes may be arranged obliquely with respect to the PN column layer in the planar direction of the silicon substrate 1.

When the SJ-MOS 100 is manufactured, an alignment process for forming the gate electrodes 20 in a width Wn of the N type columns 2n is required for reducing an on resistance. In a case where the gate electrodes and the PN column layer are arranged orthogonally in the planar direction of silicon substrate 1, as the SJ-MOS 200 shown in FIG. 9B, the alignment process can be omitted. Thus, a production cost can be reduced.

In the SJ-MOS, it is required to reduce the on resistance and improve a switching speed (i.e., reducing a switching loss). The reduction of the on resistance and the reduction of a switching loss have a trade-off relation therebetween. In order to reduce the on resistance, arrangement densities of the gate electrodes 20 and 40 and arrangement densities of the N type columns 2n and the P type columns 2p in the PN column layers 10 and 30 are required to be high. In contrast, in order to reduce the switching loss, the arrangement densities of the gate electrodes 20 and 40 are required to be low for reducing gate capacitance. The capacitance changes in accordance with areas of the sidewall insulation layers 5. In a case where the PN column layer and the gate electrodes are arranged orthogonally in the planar direction of the silicon substrate 1, as the SJ-MOS 200, the arrangement of the gate electrode and the PN column layer is less limited and a design flexibility is large compared with a case where the PN column layer and the gate electrodes are arranged in parallel, as the SJ-MOS 100.

In a manufacturing method of the PN column layer 30 of the SJ-MOS 200, a plurality of trenches are formed in the silicon substrate 1 that has an n type conductivity, and the p type columns 2p are formed by an epitaxial growth so as to fill the trenches, for example. However, when the p type columns 2p are formed, a void may be generated in the PN column layer 30 depending on a condition, and thereby the high breakdown voltage may not be obtained and the leak current in the PN column layer 30 may increase.

SUMMARY OF THE INVENTION

In view of the foregoing problems, it is an object of the present invention to provide a semiconductor device having a super junction structure. Another object of the invention is to provide a method of manufacturing the semiconductor device.

According to an aspect of the invention, a semiconductor device includes a silicon substrate, a PN column layer, a channel-forming layer, a plurality of source regions, and a plurality of gate electrodes. The silicon substrate has a first conductivity type and has a (110)-oriented surface. The silicon substrate provides a drain region. The PN column layer is made of a silicon epitaxial layer and includes a plurality of first columns having the first conductivity type and a plurality of second column having a second conductivity type. Each of the first columns and the second columns has an approximately rectangular parallelepiped shape. The first columns and the second columns are alternately arranged on the (110)-oriented surface of the silicon substrate in a planer direction of the silicon substrate in such a manner that the first columns contact the second columns on (111)-oriented surfaces, respectively. The channel-forming layer is made of a silicon layer and has the second conductivity type. The channel-forming layer is disposed on the PN column layer. Each of the source regions has the first conductivity type and is disposed at a surface portion of the channel-forming layer. Each of the gate electrodes has an approximately rectangular parallelepiped shape and is disposed to penetrate through the channel-forming layer. Each of the gate electrodes is adjacent to the source region and has side surfaces that cross the contact surfaces of the first columns and the second columns in a plane of the silicon substrate.

When the PN column layer is formed, a plurality of trenches is formed in the semiconductor substrate and the trenches are filled by an epitaxial growth, for example. In the present semiconductor device, the number of void that is generated in the PN column layer when the PN column layer is formed by the above-described method can be reduced. Thus, a breakdown voltage can be improved and a leak current can be reduced.

According to another aspect of the invention, a method of manufacturing a semiconductor device, includes: preparing a silicon substrate that has a first conductivity type, that has a (110)-oriented surface, and that provides a drain region; forming a first epitaxial layer on the (110)-oriented surface of the silicon substrate, in which the first epitaxial layer has a first conductivity type and is made of silicon; forming a plurality of trenches in the first epitaxial layer in such a manner that the plurality of trenches are arranged in a plane of the silicon substrate, each of the trenches has an approximately rectangular parallelepiped shape, and each of the trenches has (111)-oriented sidewalls, in which a remaining first epitaxial layer provides a plurality of first columns that is separated from each other through the plurality of trenches; forming a second epitaxial so as to fill the plurality of trenches, in which the second epitaxial layer is made of silicon and has a second conductivity type, and second epitaxial layer provides a plurality of second columns that respectively contacts the plurality of first columns at a (111)-oriented surface; forming a channel-forming layer on the plurality of first columns and the plurality of second columns, in which the channel-forming layer has a second conductivity type and is made of a silicon layer; forming a plurality of source regions that has a first conductivity type at a surface portion of the channel-forming layer; forming a plurality of gate electrodes that has an approximately rectangular parallelepiped shape in such a manner that the plurality of gate electrodes penetrate through the channel-forming layer to be adjacent to the plurality of source regions, respectively, and side surfaces of the plurality of gate electrodes cross the contact surfaces of the first columns and the second columns in the plane of the silicon substrate.

In the above-described manufacturing method, the number of void generated in the PN column layer can be reduced. Thus, in the semiconductor device manufactured by the above-described method, a breakdown voltage can be improved and a leak current can be reduced.

BRIEF DESCRIPTION OF THE DRAWINGS

Additional objects and advantages of the present invention will be more readily apparent from the following detailed description of preferred embodiment when taken together with the accompanying drawings. In the drawings.

DETAILED DESCRIPTION OF THE PREFERRED EMBODIMENT

Figure 1A:
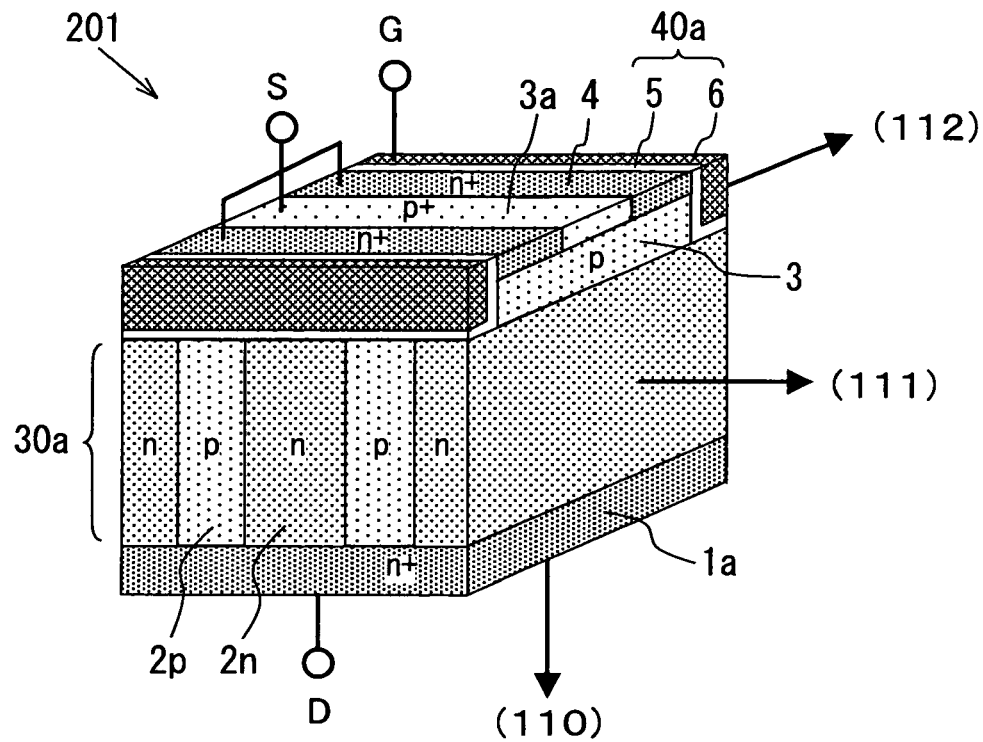
FIG. 1A is a schematic perspective view showing a semiconductor device according to a first example of an embodiment of the invention.
Figure 1B:
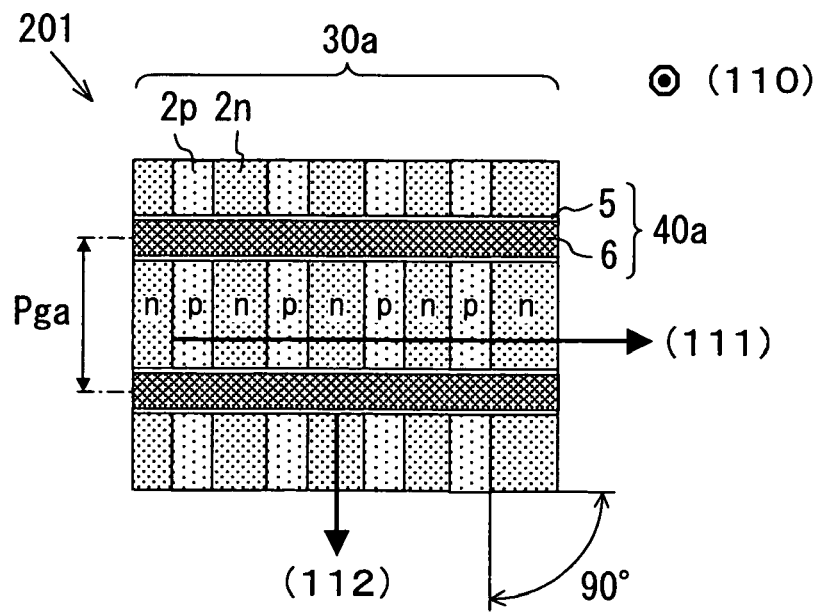
FIG. 1B is a schematic top view showing an arrangement of a silicon substrate, a PN column layer, and gate electrodes in the semiconductor device.

A super-junction metal oxide semiconductor (SJ-MOS) 201 according to a first example of an embodiment of the invention will now be described with reference to FIGS. 1A and 1B. The SJ-MOS 201 is an N-channel SJ-MOS and has an N+ type silicon substrate 1a functioning as a drain region. The SJ-MOS 201 has a PN column layer 30a on the silicon substrate 1a. The PN column layer 30a is an epitaxial layer made of silicon and includes N type columns 2n and P type columns 2p. The N type columns 2n and the P type columns 2p have approximately rectangular parallelepiped shapes and are alternately arranged on the silicon substrate 1a.

On the PN column layer 30a, a P type layer 3 functioning as a channel-forming layer is formed. For example, the P type layer 3 is obtained by an epitaxial layer made of silicon or ion implantation. At surface portions of the P type layer 3, N+ type regions 4 functioning as source regions are formed. Trench insulation gate electrodes (gate electrodes) 40a are disposed to penetrate through the P type layer 3. Each of the gate electrodes 40a has an approximately rectangular parallelepiped shape and has a sidewall insulation layer 5 and an embedded polysilicon 6. The gate electrodes 40a are adjacent to the N+ type regions 4, respectively. Between the N+ type regions 4, a P+ type region 3a is provided for fixing an electric potential of the P type layer 3. The P+ type region 3a is an ohmic junction region, and is coupled with the N+ type regions 4.

In the SJ-MOS 201, the gate electrodes 40a are arranged orthogonally to the PN column layer 30a in a planar direction of the silicon substrate 1a. In a case where conductivity types of each component of the SJ-MOS 201 are reversed, a P channel SJ-MOS is provided.

Figure 9A:
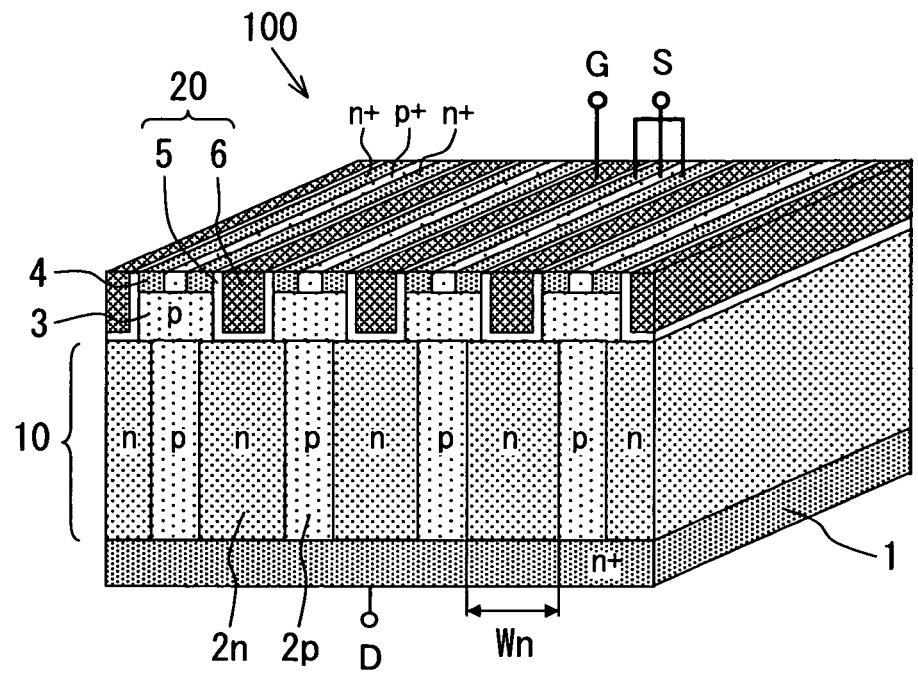
FIG. 9A is a schematic perspective view showing a semiconductor device according to a first example of the related art.
Figure 9B:
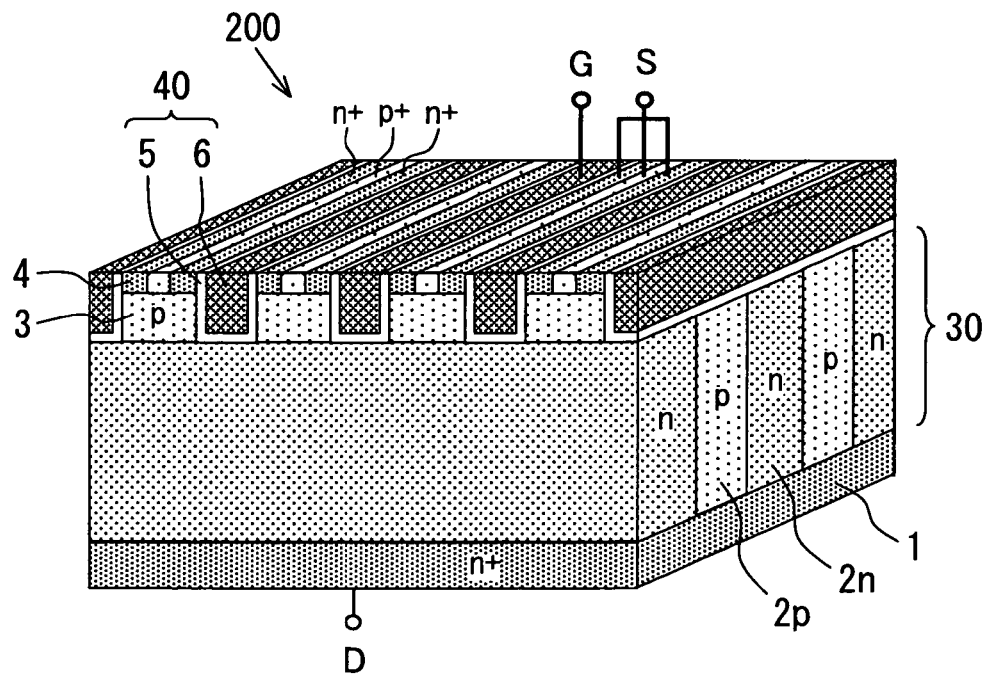
FIG. 9B is a schematic perspective view showing a semiconductor device according to a second example of the related art.

The SJ-MOS 201 has a structure similar to the SJ-MOS 200 shown in FIG. 9B. However, in the SJ-MOS 201, a plane direction of the silicon substrate 1a, a forming direction of the PN column layer 30a and a forming direction of the gate electrodes 40a are defined specifically for improving a property of the SJ-MOS 201.

The silicon substrate 1a has a (110)-oriented surface. In the PN column layer 30a, the N type columns 2n contact the P type columns 2p on (111)-oriented surfaces, respectively. Each of side surfaces of the gate electrodes 40a is arranged orthogonally to the contact surfaces of the N type columns 2n and the P type columns 2p in a plane of the silicon substrate 1a. Thus, each of the side surfaces of the gate electrodes 40a contacts a (112)-oriented surface of the P type layer 3. In the present case, an angle between the gate electrodes 40a and the contact surfaces of the N type columns 2n and the P type columns 2p is about 90°.

Figure 2:
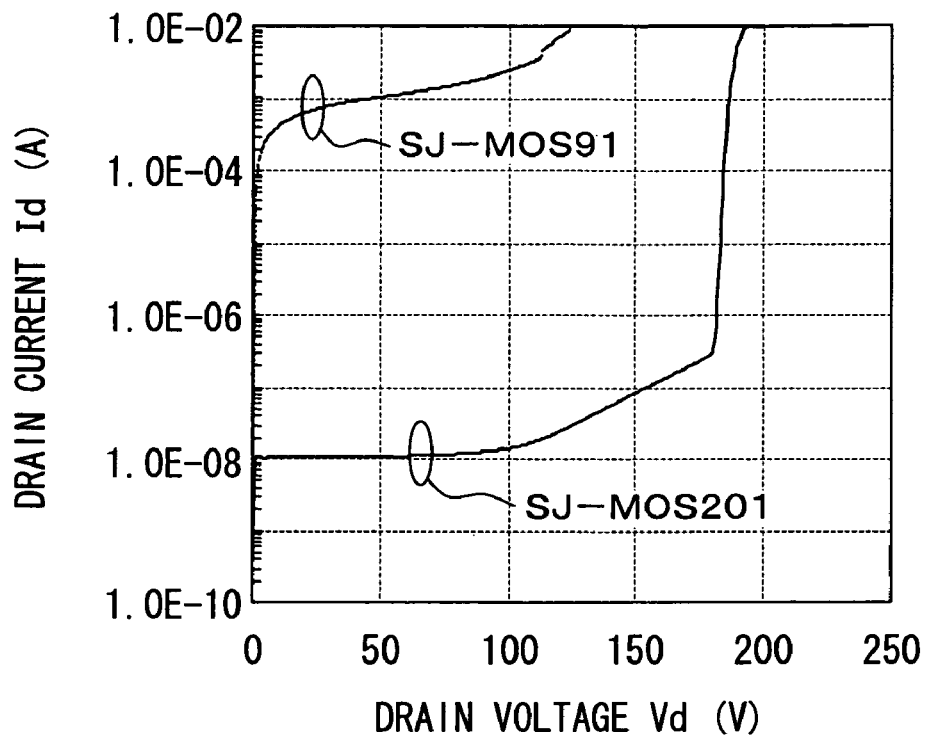
FIG. 2 is a graph showing a relationship between a drain voltage and a drain current.

Relationships between drain voltages Vd and drain currents Id of the SJ-MOS 201 and an SJ-MOS 91 according to a comparative example will be described with reference to FIG. 2. The SJ-MOS 91 includes a silicon substrate having a (100)-oriented surface and a PN column layer having (100)-oriented contact surfaces.

As described above, the SJ-MOS 201 includes the silicon substrate 1a having the (110)-oriented surface and the PN column layer 30a in which the N type columns 2n contact the P type columns 2p on the (111)-oriented surfaces, respectively. In the SJ-MOS 201, the number of void generated in the PN column layer 30a can be reduced compared with the SJ-MOS 91. Thus, in the SJ-MOS 201, a breakdown voltage can be improved and a leak current (Id) can be reduced compared with the SJ-MOS 91, as shown in FIG. 2.

In addition, in the SJ-MOS 201, the side surfaces of the gate electrodes 40a are arranged orthogonally to the (111)-oriented contact surfaces of the N type columns 2n and the P type columns 2p. Thus, an arrangement of the gate electrodes 40a and the PN column layer 30a is less limited compared with an SJ-MOS 100 shown in FIG. 9A, in which a PN column layer 10 and gate electrodes 20 are arranged in parallel. Thus, in the SJ-MOS 201, a design flexibility for reducing an on resistance and a switching loss is large. Furthermore, because an alignment process can be omitted, a production cost can be reduced. In the present way, the SJ-MOS 201 can improve the relationship between a low on voltage and a high switching speed and can be manufactured at a low cost.

An SJ-MOS 202 according to a second example of the embodiment will be described with reference to FIG. 3. The SJ-MOS 202 includes the silicon substrate 1a having the (110)-oriented surface and the PN column layer 30a having the (111)-oriented contact surfaces, in a manner similar to the SJ-MOS 201 shown in FIG. 1. Thus, also in the SJ-MOS 202, the breakdown voltage can be improved compared with the SJ-MOS 91, which includes the silicon substrate having the (100)-oriented surface and the PN column layer having the (100)-oriented contact surfaces. In addition, the leak current Id at the PN column layer 30a can be reduced compared with the SJ-MOS 91.

In the SJ-MOS 201, each of the side surfaces of the gate electrodes 40a are arranged orthogonally to the contact surfaces of the N type columns 2n and the P type columns 2p in the plane of the silicon substrate 1a. Thus, each of the side surfaces of the gate electrodes 40a contacts the (112)-oriented surface of the P type column layer 30a.

In the SJ-MOS 202, each side surfaces of gate electrodes 40b contacts a (100)-oriented surface of the P type layer 3. Thus, the gate electrodes 40b are arranged obliquely to the contact surfaces of the N type columns 2n and the P type columns 2p. In the present case, an angle between the gate electrodes 40b and the contact surfaces is about 54.7°.

In the SJ-MOS 202, an arrangement of the gate electrodes 40b and the PN column layer 30a is less limited compared with the SJ-MOS 100 shown in FIG. 9A, in which the PN column layer 10 and the gate electrodes 20 are arranged in parallel. Thus, a design flexibility for reducing an on resistance and a switching loss is large. Furthermore, because an alignment process can be omitted, a production cost can be reduced.

In the SJ-MOS 201, the gate electrodes 40a are arranged orthogonally to the PN column layer 30a in the plane of the silicon substrate 1a. Thus, various tools used at a manufacturing process can be positioned easily compared with the SJ-MOS 202 in which the gate electrodes 40b are arranged obliquely to the PN column layer 30a. Thus, the production cost can be reduced.

In contrast, in the SJ-MOS 202, the side surfaces of the gate electrodes 40b contact the P type layer 3 on the (100)-oriented surface, at which an interface state density is less compared with other plane direction. Thus, in the SJ-MOS 202, electric properties including the on resistance can be improved compared with a case where the gate electrodes 40b contact the P type layer 3 at a surface in other plane direction.

Figure 4:
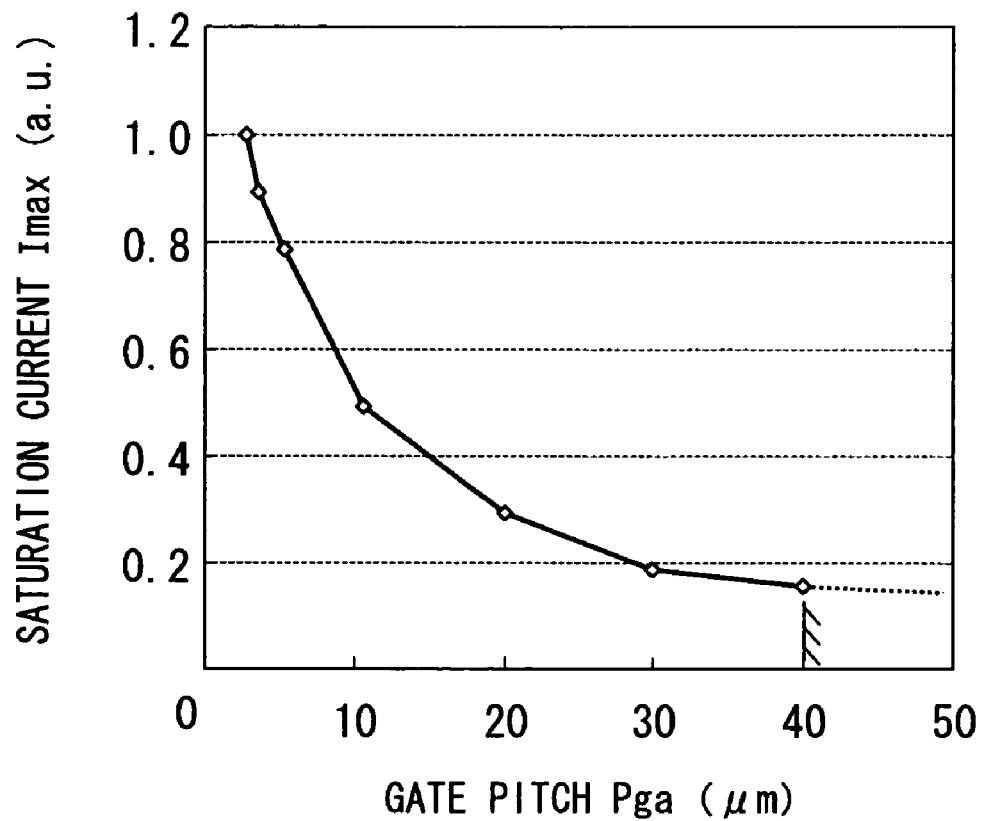
FIG. 4 is a graph showing a relationship between a gate pitch and a saturation current of the semiconductor device according to the first example.

In the SJ-MOS 201, the gate electrodes 40a are arranged at a predetermined interval (i.e., predetermined gate pitch) in a plane of the silicon substrate 1a. When the gate pitch Pga is greater than about 40 μm, a saturation current Imax becomes a constant small value, as shown in FIG. 4, and an element is required to have a large area for flowing a predetermined electric current. When the gate pitch Pga of the gate electrodes is less than or equal to about 40 μm, the SJ-MOS 201 can have a predetermined allowable current. Furthermore, when the gate pitch Pga of the gate electrodes is less than or equal to about 20 μm, the SJ-MOS 201 can have a large allowable current.

Figure 5A:
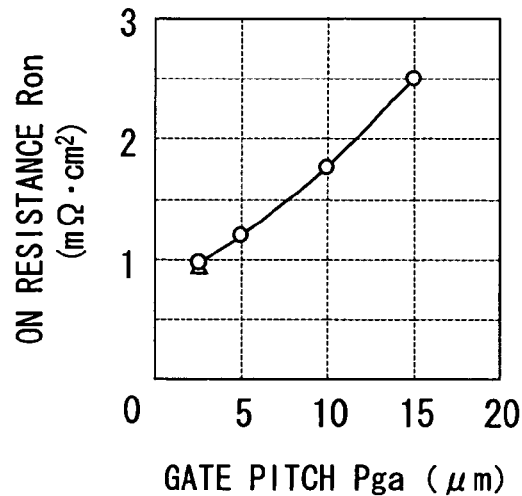
FIG. 5A is a graph showing a relationship between the gate pitch and an on resistance.
Figure 5B:
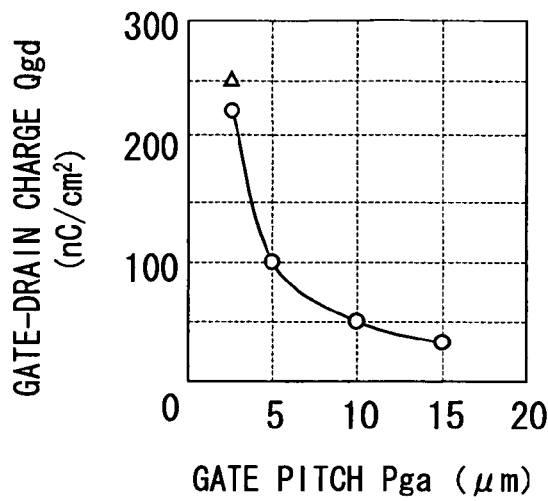
FIG. 5B is a graph showing a relationship between the gate pitch and a gate-drain charge.
Figure 5C:
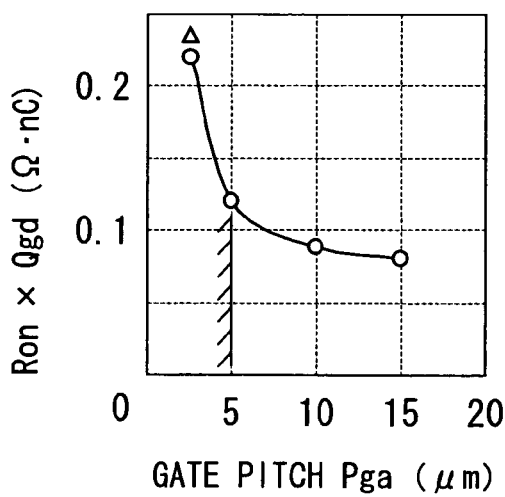
FIG. 5C is a graph showing a relationship between the gate pitch and a product of the on resistance and the gate-drain charge.

The switching loss is affected by a drain-gate charge between the gate electrodes 40a and the silicon substrate 1a functioning as the drain region. As shown in FIG. 5C, when the gate pitch Pga is greater than or equal to about 5 μm, a product of the on resistance Ron and the drain-gate charge Qgd is reduced. Thus, the property of the SJ-MOS 201 can be improved. When the gate pitch Pga is greater than or equal to about 10 μm, the on resistance Ron increases, as shown in FIG. 5A. However, the drain-gate charge Qgd between the gate electrodes 40a and the drain region is reduced, as shown in FIG. 5B, and the switching speed is improved.

The on resistance Ron can be reduced by changing an impurity concentration of the PN column layer 30a. For comparison, an on resistance and a drain-gate charge of an SJ-MOS, in which the gate electrodes 40a and the PN column layer 30a are arranged in parallel, are shown by the triangles in FIGS. 5A-5C.

In FIG. 4 and FIGS. 5A-5C, the relationships between the gate pitch Pga of the gate electrodes 40a of the SJ-MOS 201 and the saturation current Imax, the on resistance Ron, and the drain-gate charge Qgd are shown. A gate pitch Pgb of the gate electrodes 40b of the SJ-MOS 202 has relationships similar to the gate pitch Pga of the gate electrodes 40a of the SJ-MOS 201.

Figure 6A:
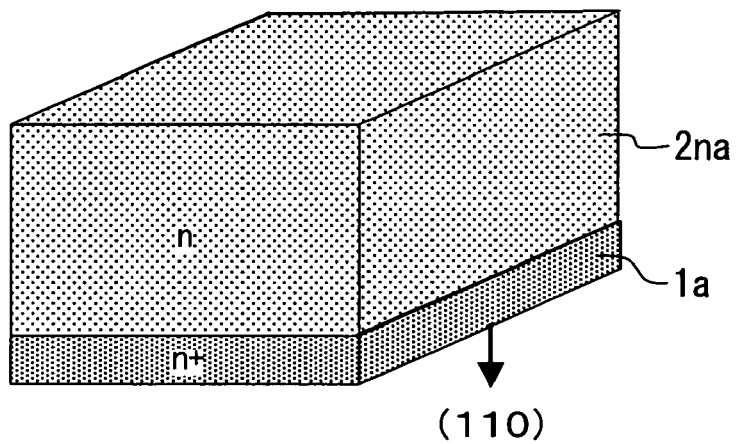
FIGS. 6A-6C are schematic perspective views showing a part of a process for manufacturing the semiconductor device according to the first example.

An exemplary method of manufacturing the SJ-MOS 201 will now be described with reference to FIGS. 6A-6C and FIG. 7. At first, as shown in FIG. 6A, an N type epitaxial-layer 2na made of silicon is formed on the (110)-oriented surface of the N+ type silicon substrate 1a. The N type epitaxial-layer 2na has an impurity concentration in a ranged from about $1 \times 10^{15}$ cm$^{-3}$ to about $5 \times 10^{16}$ cm$^{-3}$, for example.

Figure 6B:
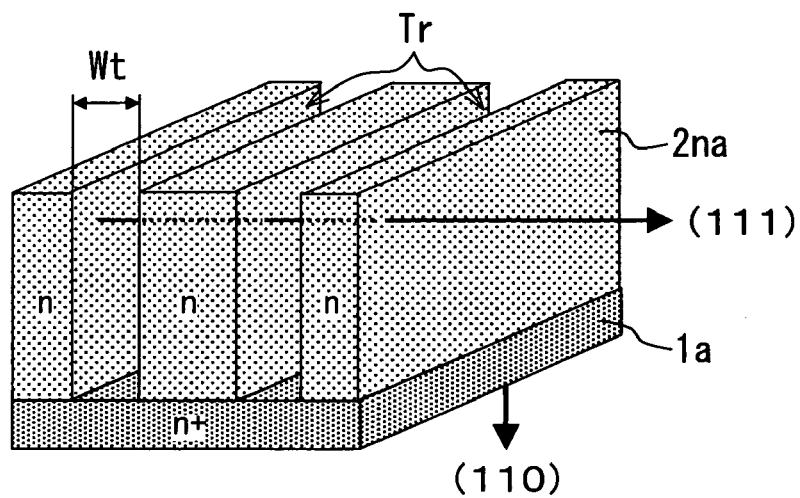

Then, as shown in FIG. 6B, a plurality of trenches Tr is formed in the N type epitaxial-layer 2na. Each of the trenches Tr has an approximately rectangular parallelepiped shape and has (111)-oriented side surfaces. For example, each of the trenches Tr has a width Wt about 0.8 μm and a depth about 13 μm. For example, the trenches Tr are formed by a wet etching. When the trenches Tr are provided on the (110)-oriented surface of the silicon substrate 1a, the trenches Tr can have (111)-oriented side surfaces. In a case where the trenches Tr are formed by the wet etching, a damage of the trenches Tr can be reduced and a cost for forming the trenches Tr can be reduced compared with a case where the trenches Tr are formed by a dry etching.

Figure 6C:
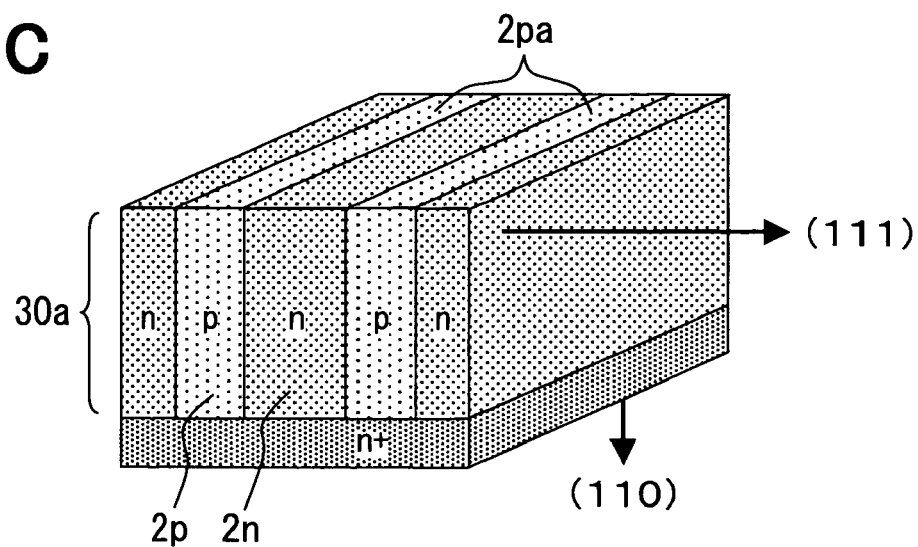

Next, as shown in FIG. 6C, a P type epitaxial-layer 2pa made of silicon is formed to fill the trenches Tr. For example, the P type epitaxial-layer 2pa is formed by a low-pressure chemical vapor deposition (LP-CVD). In the LP-CVD, for example, silicon source gas (e.g., $SiH_2Cl_2$) and halide gas (e.g., HCl) are used simultaneously so that the P type epitaxial-layer 2pa grows to fill the trenches Tr.

In the present case, a growth rate at bottom portions of the trenches Tr is higher than a growth rate at opening portions of the trenches Tr, and thereby the P type epitaxial-layer 2pa can grow from the bottom portions of the trenches Tr. Thus, the number of a void and a crystal defect in the P type epitaxial-layer 2pa can be reduced. For example, a growth temperature is in a range from about 800° C. to about 1150° C., a vacuum degree is about 40 Torr, a flow rate of $SiH_2Cl_2$ is about 0.1 slm, a flow rate of $H_2$ is about 30 slm, and a flow rate of HCl is about 0.5 slm. The remaining N type epitaxial-layer 2na becomes the N type columns 2n, and the P type epitaxial-layer 2pa in the trenches Tr becomes the P type columns 2p. In the present way, the PN column layer 30a is formed.

Figure 8:
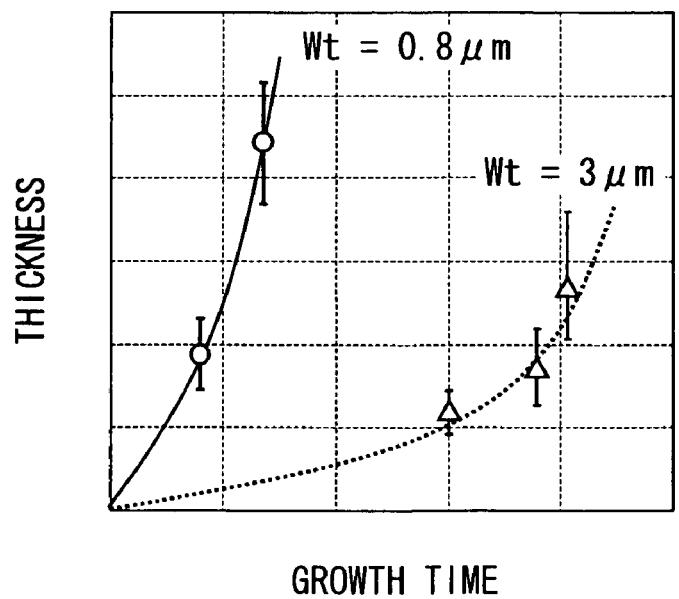
FIG. 8 is a graph showing a relationship between a width of a trench and a glowing rate of a P type epitaxial layer.

When the width Wt of the trenches Tr is large, a growth rate of the P type epitaxial-layer 2pa is slow, as shown in FIG. 8. Thus, the width Wt of the trenches Tr is less than or equal to about 3 μm, for example. In the present case, an aspect ratio of the trenches Tr is high, and the growth time of the P type epitaxial-layer 2pa can be reduced. Thus, the PN column layer 30a, in which the N type columns 2n and the P type columns 2p are arranged with a high arrangement density, can be provided at a high throughput. When the width Wt is greater than or equal to 0.1 μm, the trenches Tr can be formed with a high degree of accuracy.

Figure 7:
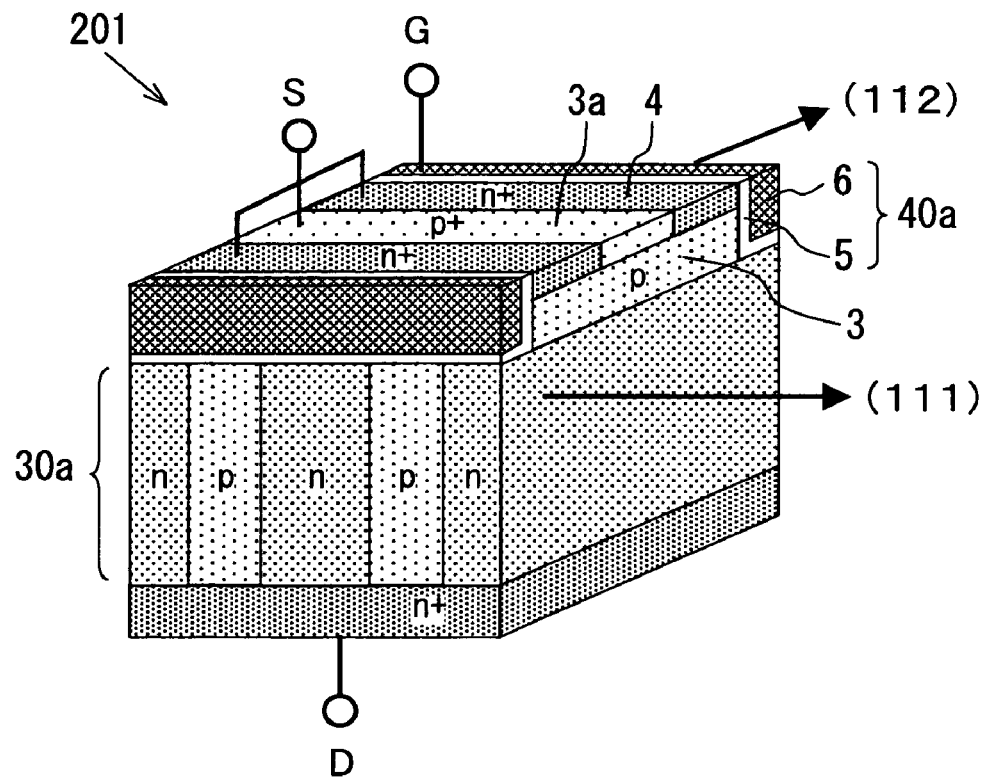
FIG. 7 is a schematic perspective view showing another part of the manufacturing process.

After the PN column layer 30a is formed, the P type layer 3 functioning as the channel-forming layer is formed on the PN column layer 30a, as shown in FIG. 7. For example, the P type layer 3 is made of a silicon epitaxial layer. Then, at the surface portion of the P type layer 3, the N+ type regions 4 and the P+ type region 3a are formed. The N+ type regions 4 function as the source regions. The P+ type region 3a is provided for fixing the electric potential of the P type layer 3. Next, a plurality of trench having an approximately rectangular parallel piped shape is formed to penetrate through the P type layer 3. The trenches are adjacent to the N+ type regions 4 and sidewalls of the trenches are located at the (112)-oriented surfaces of the P type layer 3. Then, the sidewall insulation layers 5 are formed and the trenches are filled with the embedded polysilicon 6. In the present way, the gate electrodes 40a are formed.

Figure 3:
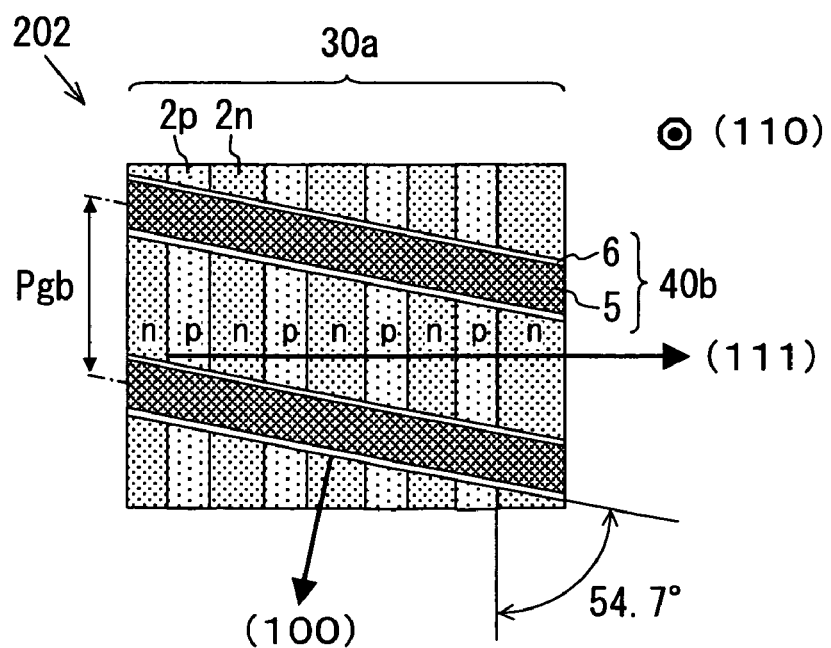
FIG. 3 is a schematic top view showing an arrangement of a silicon substrate, a PN column layer, and gate electrodes in a semiconductor device according to a second example of the embodiment.

The SJ-MOS 202 shown in FIG. 3 can be manufactured by a method similar to the above-described method shown in FIGS. 6A-6C and FIG. 7. In the manufacturing method of the SJ-MOS 202, the gate electrodes 40a are formed to contact the (100)-oriented surface of the P type layer 3 in the process shown in FIG. 7.

In the manufacturing method shown in FIGS. 6A-6C and FIG. 7, the PN column layer 30a can be formed with a high degree of accuracy compared with a case where an ion implantation is selectively performed to the N type epitaxial-layer 2na, and then a thermal diffusion of the implanted ion is performed to form the N type columns 2n and the P type columns 2p.

In the SJ-MOS 201 and the SJ-MOS 202, the silicon substrate 1a functioning as the drain region has the (110)-oriented surface, and the PN column layer 30a has the (111)-oriented contact surfaces. Thus, the number of the void generated at the epitaxial growth can be reduced compared with a case where the silicon substrate has the (100)-oriented surface and the PN column layer has the (100)-oriented contact surfaces. Thereby, in the SJ-MOS 201 and the SJ-MOS 202, the breakdown voltage can be improved and the leak current in the PN column layer 30a can be reduced, as shown in FIG. 2.

As a result, in the semiconductor device including the gate electrodes and the PN column layer which are arranged orthogonally, the property of the SJ-MOS can be improved while reducing the on resistance and the switching loss. In addition, the SJ-MOS can be manufactured at a low cost.

What is claimed is:

1. A semiconductor device comprising:
a silicon substrate that has a first conductivity type, that has a (110)-oriented surface, and that provides a drain region;
a PN column layer that is made of a silicon epitaxial layer and that includes a plurality of first columns having the first conductivity type and a plurality of second columns having a second conductivity type, wherein each of the first columns and the second columns has an approximately rectangular parallelepiped shape, and the plurality of the first columns and the plurality of the second columns are alternately arranged on the (110)-oriented surface of the silicon substrate in a planer direction of the silicon substrate in such a manner that the plurality of first columns contacts the plurality of second columns on a (111)-oriented surface, respectively;
a channel-forming layer that is made of a silicon layer, that has the second conductivity type, and that is disposed on the PN column layer;
a plurality of source regions that has the first conductivity type and that is disposed at a surface portion of the channel-forming layer; and
a plurality of gate electrodes that has an approximately rectangular parallelepiped shape, that is disposed to penetrate through the channel-forming layer, and that is arranged adjacent to the plurality of source regions, respectively, wherein each of the gate electrodes has side surfaces that cross the contact surfaces of the plurality of first columns and the plurality of second columns in a plane of the silicon substrate, and each of the side surfaces of the plurality of gate electrodes contacts a (112)-oriented surface of the channel-forming layer.

2. The semiconductor device according to claim 1, wherein:
the plurality of gate electrodes is arranged in a plane of the silicon substrate at a predetermined interval; and
the predetermined interval is less than or equal to 40 μm.

3. The semiconductor device according to claim 2, wherein the predetermined interval is less than or equal to 20 μm.

4. The semiconductor device according to claim 2, wherein the predetermined interval is greater than or equal to 5 μm.

5. The semiconductor device according to claim 4, wherein the predetermined interval is greater than or equal to 10 μm.

6. A semiconductor device comprising:
- a silicon substrate that has a first conductivity type, that has a (110)-oriented surface, and that provides a drain region;
- a PN column layer that is made of a silicon epitaxial layer and that includes a plurality of first columns having the first conductivity type and a plurality of second columns having a second conductivity type, wherein each of the first columns and the second columns has an approximately rectangular parallelepiped shape, and the plurality of the first columns and the plurality of the second columns are alternately arranged on the (110)-oriented surface of the silicon substrate in a planer direction of the silicon substrate in such a manner that the plurality of first columns contacts the plurality of second columns on a (111)-oriented surface, respectively;
- a channel-forming layer that is made of a silicon layer, that has the second conductivity type, and that is disposed on the PN column layer;
- a plurality of source regions that has the first conductivity type and that is disposed at a surface portion of the channel-forming layer; and
- a plurality of gate electrodes that has an approximately rectangular parallelepiped shape, that is disposed to penetrate through the channel-forming layer, and that is arranged adjacent to the plurality of source regions, respectively, wherein each of the gate electrodes has side surfaces that cross the contact surfaces of the plurality of first columns and the plurality of second columns in a plane of the silicon substrate, and each of the side surfaces of the plurality of gate electrodes contacts a (100)-oriented surface of the channel-forming layer.

7. The semiconductor device according to claim 6, wherein
the plurality of gate electrodes is arranged in a plane of the silicon substrate at a predetermined interval, and
the predetermined interval is less than or equal to 40 μm.

8. The semiconductor device according to claim 7, wherein the predetermined interval is less than or equal to 20 μm.

9. The semiconductor device according to claim 7, wherein the predetermined interval is greater than or equal to 5 μm.

10. The semiconductor device according to claim 9, wherein the predetermined interval is greater than or equal to 10 μm.

* * * * *